United States Patent [19]

Park

[11] Patent Number: 5,318,923

[45] Date of Patent: * Jun. 7, 1994

[54] METHOD FOR FORMING A METAL WIRING LAYER IN A SEMICONDUCTOR DEVICE

[75] Inventor: Chang-soo Park, Seoul, Rep. of Korea

[73] Assignee: Samsung Electronics Co. Ltd., Kyunggi, Rep. of Korea

[ * ] Notice: The portion of the term of this patent subsequent to Nov. 30, 2010 has been disclaimed.

[21] Appl. No.: 897,294

[22] Filed: Jun. 11, 1992

Related U.S. Application Data

[63] Continuation-in-part of Ser. No. 585,218, Sep. 19, 1990.

[51] Int. Cl.⁵ ............................................ H01L 21/44
[52] U.S. Cl. .................................. 437/188; 437/199; 437/203; 437/247; 437/197
[58] Field of Search ............... 437/203, 197, 198, 199, 437/188, 247

[56] References Cited

U.S. PATENT DOCUMENTS

| | | | |
|---|---|---|---|
| 4,970,176 | 11/1990 | Tracy et al. | 437/197 |
| 5,071,791 | 12/1991 | Inoue et al. | 437/203 |
| 5,147,819 | 9/1992 | Yu et al. | 437/197 |

FOREIGN PATENT DOCUMENTS

| | | | |
|---|---|---|---|
| 0097848 | 1/1984 | European Pat. Off. | 437/197 |
| 0202572 | 11/1986 | European Pat. Off. | 437/203 |
| 0293739 | 11/1987 | Japan | 437/203 |

*Primary Examiner*—Brian E. Hearn
*Assistant Examiner*—Tuan Nguyen
*Attorney, Agent, or Firm*—Morgan & Finnegan

[57] ABSTRACT

A method for forming a metal layer in a semiconductor device is disclosed. The method includes a first process for depositing a metal at an optional temperature after forming the pattern of a contact hole on the semiconductor substrate on which the stepped portion is formed, and a second process for annealing the deposited metal in a sputtering reaction chamber to fill up the contact hole with said metal. According to the invention, it is possible to completely fill up a contact hole having a high aspect ratio.

21 Claims, 2 Drawing Sheets

METHOD FOR FORMING A METAL WIRING LAYER IN A SEMICONDUCTOR DEVICE

CROSS-REFERENCE TO RELATED APPLICATION

This application is a continuation-in-part of our co-pending application, Ser. No. 07/585,218 filed on Sept. 19, 1990, which is incorporated herein by reference.

FIELD OF THE INVENTION

The present invention relates to a metallization process, and more particularly to a method for forming a metal wiring layer in a semiconductor device having a large topography.

BACKGROUND OF THE INVENTION

As a result of the rapid progress of semiconductor fabrication technology and extension of the application field for memory devices, large capacity memory devices have been developed.

Such large capacity memory devices have been developed by memory cell researchers based on a fine-process technique which doubles memory capacity in each generation. In particular, the metallization process in producing semiconductor devices is one of the important processes in the fine-process technique of the memory device.

The metallization process can be applied to form the word line connecting the gate electrodes, and to form connections interconnecting the source or drain diffusing region and other elements of the memory device.

Conventionally, the metal layer between the devices has been formed mainly by physical deposition using a sputtering process as shown in FIG. 1.

Referring to FIG. 1, a stepped-portion 1 having a predetermined pattern is formed on the semi-conductor substrate 10. A contact hole 2 opening for a metallization is then formed in the stepped-portion 1. After that, the metal layer 3 is deposited by a sputtering process on the stepped-portion 1, on the inner surface of the opening, and on the semi-conductor substrate 10 at the bottom of the opening. However, due to shadowing, cusping may form along the sides of the opening, causing a disconnection, and leaving the metal layer 3 with limitations in its use. Accordingly, degradation of the step coverage characteristic occurs in the inner wall of the contact hole.

In more detail, according to the tendency towards higher densities in semiconductor devices, it is difficult to reduce the vertical geometric size in the same ratio as that of the horizontal direction of the contact hole, resulting in an increase of the aspect ratio. As a result, because of shadowing effects by the step, it is difficult to achieve a sufficient step coverage characteristic for contact holes having a high aspect ratio. This results in the disconnection of the metal layer as shown in FIG. 1.

To solve the above problem, filling up the contact hole has been attempted in various manners. For instance, there is a selective tungsten filling up technique which fills up and levels the contact hole with tungsten before the metal layer is deposited, and there is a contact hole filling up technique using polycrystalline silicon which is excellent in the step coverage characteristic.

However, in the case of the above selective tungsten filling up technique, there are problems in that the leakage current is increased due to the interface reaction of the tungsten with the silicon substrate, and tungsten's adhesion is insufficient.

In the case of the filling up technique using polycrystalline silicon, it is difficult to maintain the contact resistance within the contact hole at a constant level because the polycrystalline silicon must be changed into the conductor by an ion implantation. Further, the control for the amount of the implanted ion is difficult.

SUMMARY OF THE INVENTION

Accordingly, it is the object of the present invention to provide an improved method for forming a metal wiring layer in the semiconductor device comprising the steps of depositing a metal, then filling up a contact hole through an annealing process.

For achieving the above object, the present invention provides a method for forming a metal layer by connecting a metal connect through a contact hole, where the method comprises a first process for depositing a metal at an optional temperature after forming a contact hole on the semiconductor substrate on which the stepped portion is formed, and a second process for annealing the structure obtained by performing the first process.

BRIEF DESCRIPTION OF THE DRAWINGS

In the detailed description of the preferred embodiment of the present invention presented below, reference is made to the accompanying drawings in which.

DETAILED DESCRIPTION OF THE PREFERRED EMBODIMENT

Figure 1:
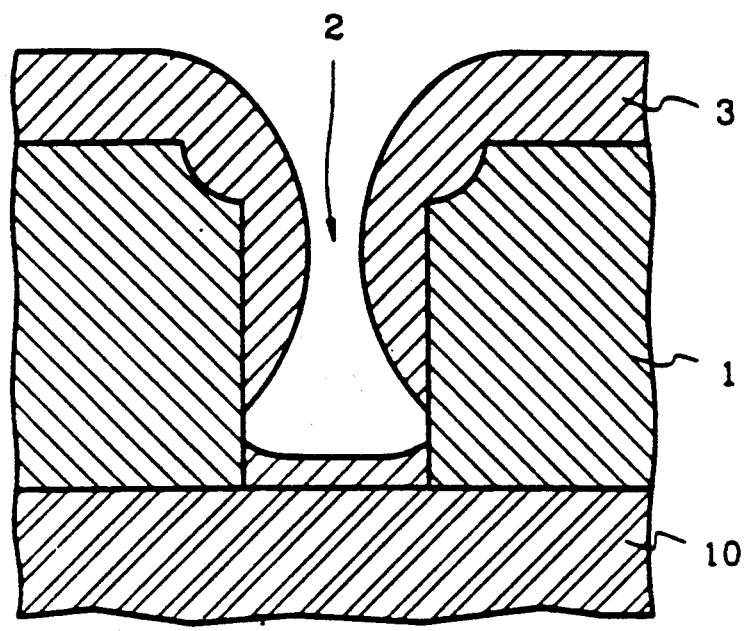
FIG. 1 is a sectional view of a metal layer manufactured by a conventional sputtering method.
Figure 2A:
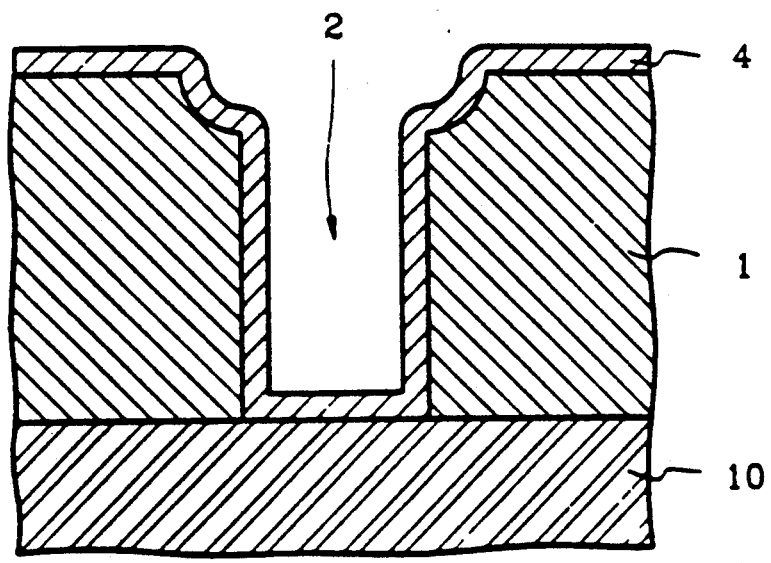
FIG. 2A to 2C show one embodiment of a method for forming the metal layer according to the present invention.

Referring to FIG. 2A, in which a process for forming a first metal wiring layer is shown, the pattern of the contact hole 2, preferably measuring 0.8 $\mu$m in diameter and having an aspect ratio greater than about 1.0, is formed on the semiconductor substrate 10 on which a stepped portion is formed. It should be noted that the contact hole 2 preferably has a diameter that is at least smaller than 1.0 $\mu$m. The substrate 10, on which the pattern is formed, is cleaned after the contact hole 2 is formed.

After performing the above process, the substrate 10 is put in the sputtering reaction chamber, in which the first metal layer 4 is formed by depositing a metal, e.g., aluminum (Al) or an aluminum alloy, to a thickness of 500Å to 3000Å at a temperature below 100° C. under a predetermined vacuum degree. The metal is preferably formed by vapor deposition in a vacuum chamber so that the atoms of the metal will have a high surface free energy. The aluminum alloy which may be used instead of pure aluminum is preferably formed by mixing silicon of 1% and copper of 0.5% by weight. Additional alloys that may be used in the present invention include an aluminum-silicon alloy, aluminum-copper alloy, aluminum-silicon-copper alloy, or an aluminum-titanium alloy.

Figure 2B:
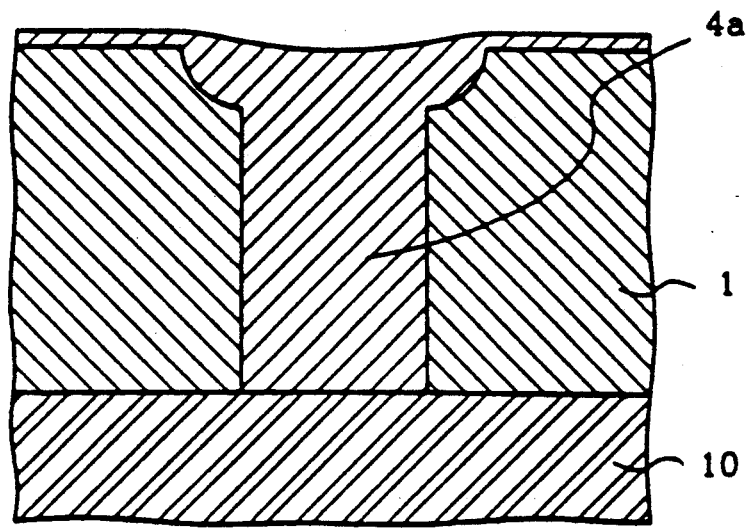

FIG. 2B illustrates a process for filling up the contact hole. After the substrate obtained by the preceding process is moved to another sputter reaction chamber without a break in the vacuum, heating is carried out for 2 minutes or more preferably at a temperature of approximately 550° C. The heating operation causes the deposited metal to migrate due to the movement of the atoms along the exterior surface, thereby filling up the contact hole (as shown in FIG. 2B). At this time, the pressure in the reaction chamber is preferably as low as possible so that the surface moving distance due to the surface moving phenomenon of aluminum is increased. In FIG. 2B, reference numeral 4a designates metal filled up in the contact hole.

Here, the heat treatment temperature in the process is preferably 80% or more of the melting point temperature of the aluminum or of the alloy used. Also, heat-treatment of the first deposited metal layer is preferably performed for more than one minute.

Figure 2C:
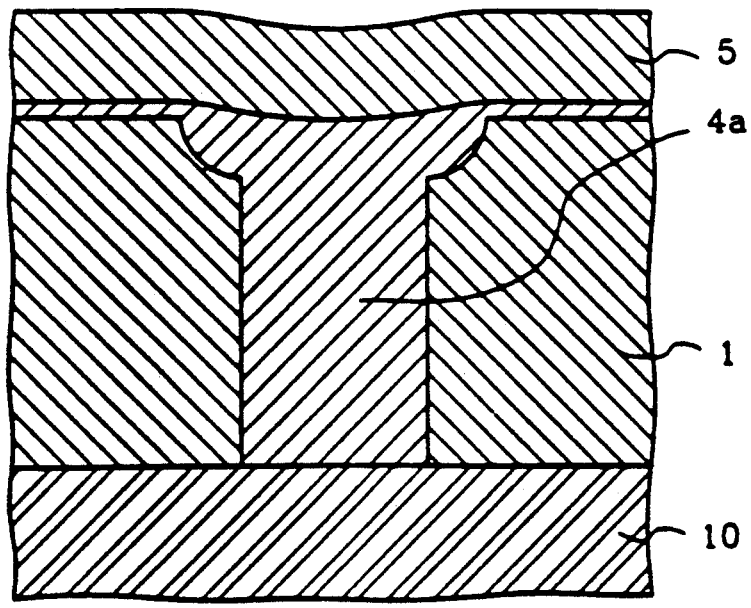

A process for forming the second metal layer 5 is shown in FIG. 2C. The second metal layer 5 is formed by depositing the second metal layer 5 at a thickness that is determined by the difference between a predetermined total thickness of the metal layers and the thickness of the first metal layer. For example, if the total required thickness of the metal layers is 6000Å and the thickness of the first metal layer remaining on the stepped portion is a hypothetical thickness of x Å, the second metal layer is formed by depositing aluminum or a metal alloy having a thickness of (6000-X)Å.

The second metal layer 5 is preferably deposited at a temperature below 350° C. At this time, it may be desirable that the thickness x of the first metal layer be minimized according to the reliability of the metallization. The temperature below 350° C. that is determined by considering the reliability factor, is based on the type of the second metal layer and is chosen to ensure the connection between the first and second metal layers. Thus, the second metal layer 5 is deposited at a temperature determined by considering its reliability, thereby completing the formation of the metal layer. The second metal layer 5 may be deposited on the first metal layer 4a during and/or after heat-treatment of the first metal layer.

As mentioned above, according to the present invention, the contact hole can be easily and fully filled up first by depositing a metal by using the sputtering equipment used for the conventional physical depositing method, and then by annealing the deposited metal, so that it is possible to completely fill up the contact hole, even one having a high aspect ratio.

In addition, if the total thickness of the required metal layer is large, it is possible to control the thickness by successively depositing the metal layer after filing up the contact hole.

It will be noted that the method for forming the metal layer according to the present invention is applicable to all semiconductor devices for connecting the metal layer through the contact hole.

What is claimed is:

1. A method for forming a metal wiring layer, whose upper surface is smoothly planarized, on an insulating layer including at least one contact hole having a predetermined diameter and formed on a semiconductor substrate, comprising the steps of:

depositing a first metal material of substantially uniform thickness on the surface of said insulating layer, on the inside wall of the contact hole, and on the surface of said semiconductor substrate exposed by the contact hole, said first metal material having a thickness from about 1/16 to ⅜ that of the diameter of said contact hole, said first metal material deposited by physical vapor deposition at a low temperature in a vacuum chamber so that atoms on the surface of said first metal material have a high surface moving distance; and post-heating said deposited first metal material in a vacuum at a temperature ranging from 80% of the melting point temperature of the deposited first metal material to the melting point temperature, for an appropriate time, by an in-situ processing method, after said deposition step.

2. A method as claimed in claim 1, further comprising the step of depositing a second metal material on said first metal material at room temperature by physical vapor deposition, said second material having a thickness corresponding to a subtraction of the thickness of said first metal material from a predetermined total thickness of said metal wiring layer, after said post-heating step.

3. A method as claimed in claim 1, wherein said metal deposition in said first process is carried out by a sputtering 4. A method as claimed in claim 1, wherein said metal in said first process is aluminum or aluminum alloy.

5. A method as claimed in claim 1, wherein said first metal material is aluminum alloy which is formed by mixing silicon of 1% and copper of 0.5% by weight with the aluminum.

6. A method as claimed in claim 5, wherein the said aluminum is 500Å to 3000Å.

7. A method for forming a metal wiring layer, whose upper surface is smoothly planarized, on an insulating layer including at least one contact hole having a submicron diameter and formed on a semiconductor substrate, comprising the steps of:

depositing an aluminum alloy film of substantially uniform thickness on the surface of said insulating layer, on the inside wall of the contact hole, and on the surface of said semiconductor substrate exposed by the contact hole, said aluminum alloy film having a thickness from about 1/16 to ⅜ that of the diameter of said contact hole, said first metal deposited by a physical vapor deposition at a temperature below 100° C. in a vacuum chamber; and post-heating said deposited aluminum alloy film in a vacuum at a temperature of 550° C. for three minutes by an in-situ processing method, after said deposition step.

8. A method for forming a metal wiring layer, comprising the steps of:

providing a semiconductor wafer with an insulating layer having an opening formed therein;

depositing a first metal to form a first metal layer on said insulating layer and on the inner surface of said opening in a vacuum chamber so as to have a high surface free energy; and heat-treating said deposited first metal layer in a vacuum at a temperature sufficient to cause migration of said first metal, for an appropriate time, by an in-situ processing method after said deposition step, thereby completely filling said opening with said deposited first metal material.

9. A method as claimed in claim 8, wherein said first metal layer is deposited at a temperature below 100° C.

10. A method as claimed in claim 8, wherein said first metal deposited to a thickness of about 500Å to about 3000Å.

11. A method as claimed in claim 8, wherein said first metal is aluminum or an aluminum alloy.

12. A method as claimed in claim 8, further comprising the step of depositing a second metal to form a second metal layer so that the total thickness of said first metal layer and said second metal layer ranges within a predetermined thickness.

13. A method as claimed in claim 12, wherein said second metal layer is deposited while heat-treating said deposited first metal layer.

14. A method as claimed in claim 12, wherein said second metal layer is deposited after heat-treating said deposited first metal layer to completely fill said opening.

15. A method as claimed in claim 14, wherein said second metal layer is deposited at a temperature below 350° C.

16. A method as claimed in claim 11, wherein said aluminum alloy is an Al-Si alloy, Al-Cu alloy, Al-Cu-Si alloy, or Al-Ti alloy.

17. A method as claimed in claim 8, wherein said opening is a contact hole having an aspect ratio greater than about 1.0.

18. A method as claimed in claim 17, wherein said contact hole has a diameter less than 1 μm.

19. A method as claimed in claim 8, wherein said heat-treating step of said deposited first metal layer is performed for more than 1 minute.

20. A method for forming a metal wiring layer, comprising the steps of:
 providing a semiconductor wafer with an insulating layer having an opening formed therein;
 depositing a first metal to form a first metal layer on said insulating layer and on the inner surface of said opening at a low temperature in a vacuum chamber so as to have a high surface free energy; and
 heat-treating said deposited first metal layer in a vacuum at a temperature sufficient to cause migration of said first metal, for an appropriate time by an in-situ processing method after said deposition step, thereby completely filling said opening with said deposited first metal material; and
 depositing a second metal to form a second metal layer so that a metal layer has a required total thickness.

21. A method for forming a metal wiring layer, comprising the steps of:
 depositing a first metal in a vacuum chamber to form a first metal layer on an insulating layer so as to have a high surface free energy; and
 heat-treating said deposited first metal layer in a vacuum at a temperature sufficient to cause migration of said first metal, for an appropriate time, by an in-situ processing method after said deposition step, thereby causing said deposited first metal to migrate.

* * * * *